US012575425B2

(12) United States Patent
Yang et al.

(10) Patent No.:  US 12,575,425 B2
(45) Date of Patent:      Mar. 10, 2026

(54) LOW-INDUCTANCE POWER MODULE

(71) Applicant: YANGZHOU GUOYANG ELECTRONIC CO., LTD., Jiangsu (CN)

(72) Inventors: Yang Yang, Jiangsu (CN); Fengbin Hao, Jiangsu (CN); Jianxiang Xiao, Jiangsu (CN); Jie Liu, Jiangsu (CN)

(73) Assignee: YANGZHOU GUOYANG ELECTRONIC CO., LTD., Jiangsu (CN)

( * ) Notice: Subject to any disclaimer, the term of this patent is extended or adjusted under 35 U.S.C. 154(b) by 43 days.

(21) Appl. No.: 18/857,467

(22) PCT Filed: Sep. 20, 2023

(86) PCT No.: PCT/CN2023/119882
§ 371 (c)(1),
(2) Date: Oct. 17, 2024

(87) PCT Pub. No.: WO2024/067272
PCT Pub. Date: Apr. 4, 2024

(65) Prior Publication Data
US 2025/0343177 A1     Nov. 6, 2025

(30) Foreign Application Priority Data
Sep. 29, 2022   (CN) ......................... 202211203534.5

(51) Int. Cl.
*H01L 23/64*        (2006.01)
*H01L 23/495*       (2006.01)
(Continued)

(52) U.S. Cl.
CPC ........ *H01L 23/645* (2013.01); *H01L 23/4952* (2013.01); *H01L 23/49534* (2013.01);
(Continued)

(58) Field of Classification Search
CPC .... Y02B 70/10; H02M 7/5387; H02M 7/003; H01L 2924/30107; H01L 2924/19107;
(Continued)

(56) References Cited

U.S. PATENT DOCUMENTS 11,139,278 B2 * 10/2021 Niu ........................ H01L 25/071
2024/0162197 A1 * 5/2024 Prajuckamol .......... H01L 24/48

FOREIGN PATENT DOCUMENTS

CN     112435997        3/2021
CN     113488460        10/2021
(Continued)

OTHER PUBLICATIONS

"International Search Report (Form PCT/ISA/210) of PCT/CN2023/119882," mailed on Dec. 26, 2023, with English translation thereof, pp. 1-4.

(Continued)

*Primary Examiner* — Adolf D Berhane
(74) *Attorney, Agent, or Firm* — JC ONE WORLD

(57)            ABSTRACT

A low-inductance power module comprises a housing, upper-bridge MOSs, lower-bridge SBDs, lower-bridge MOSs, upper-bridge SBDs, output electrodes, a positive electrode and a negative electrode. A bottom plate is mounted inside the housing. An insulating substrate is mounted at the top of the bottom plate. A positive-electrode copper layer, a negative-electrode copper layer and an output-electrode copper layer are arranged on the upper surface of the insulating substrate. The output-electrode copper layer is divided into an upper-side output-electrode copper layer and a lower-side output-electrode copper layer.

9 Claims, 11 Drawing Sheets

(51) Int. Cl.
  *H01L 25/07* (2006.01)
  *H02M 7/00* (2006.01)
  *H02M 7/5387* (2007.01)
  *H01L 23/00* (2006.01)

(52) U.S. Cl.
  CPC .. *H01L 23/49562* (2013.01); *H01L 23/49582* (2013.01); *H01L 25/072* (2013.01); *H02M 7/003* (2013.01); *H02M 7/5387* (2013.01); *H01L 24/48* (2013.01); *H01L 2224/48227* (2013.01); *H01L 2924/12032* (2013.01); *H01L 2924/13091* (2013.01); *H01L 2924/30107* (2013.01)

(58) Field of Classification Search
  CPC . H01L 2924/13091; H01L 2924/12032; H01L 2224/49175; H01L 2224/49111; H01L 2224/48227; H01L 2224/05147; H01L 2224/05016; H01L 25/18; H01L 24/48; H01L 23/49582; H01L 23/49534; H01L 23/4952; H01L 23/053; H01L 25/072; H01L 23/645

See application file for complete search history.

(56) References Cited

FOREIGN PATENT DOCUMENTS

| CN | 216213450 | 4/2022 |
| CN | 115513166 | 12/2022 |
| WO | 2020229114 | 11/2020 |

OTHER PUBLICATIONS

"Written Opinion of the International Searching Authority (Form PCT/ISA/237) of PCT/CN2023/119882," mailed on Dec. 26, 2023, pp. 1-4.

* cited by examiner

LOW-INDUCTANCE POWER MODULE

CROSS-REFERENCE TO RELATED APPLICATION

This application is a 371 of international application of PCT application serial no. PCT/CN2023/119882, filed on Sep. 20, 2023, which claims the priority benefit of China application no. 202211203534.5, filed on Sep. 29, 2022. The entirety of each of the above-mentioned patent applications is hereby incorporated by reference herein and made a part of this specification.

TECHNICAL FIELD

The present disclosure relates to the technical field of the power-electronics power module, and specifically to a low-inductance power module.

DESCRIPTION OF RELATED ART

As a representative of the third generation of semiconductors, SiC MOSFET has the advantages such as the low high temperature loss and the high switching frequency, which can improve the efficiency of the system, reduce the size of the system, and reduce the costs of the system. Mainstream manufacturers in China and abroad have begun to promote the SiC power modules. As illustrated in FIG. 1, in the existing SiC power module, the positive electrode is in connection with the positive-electrode copper layer on the surface of the insulating substrate through a bonding wire, the lower surfaces of the upper-bridge Metal-Oxide-Semiconductor Field-Effect Transistor (MOS) and the upper-bridge Schottky barrier diode (SBD) are welded on the positive-electrode copper layer on the same side, the upper surfaces of the upper-bridge MOS and the upper-bridge SBD are in connection with the output-electrode copper layer through a common bonding wire, the output electrode is in connection with the output-electrode copper layer on the surface of the insulating substrate through a bonding wire, the lower surfaces of the lower-bridge MOS and the lower-bridge SBD are welded on the output-electrode copper layer on the same side, the upper surfaces of the lower-bridge MOS and the lower-bridge SBD are in connection with the negative-electrode copper layer through a common bonding wire, the negative electrode is in connection with the negative-electrode copper layer on the surface of the insulating substrate through a bonding wire. As illustrated in FIG. 2, when the upper-bridge MOS is operated, the current is inputted from the positive electrode, and then flowed through the positive-electrode copper layer to the lower surface of the upper-bridge MOS, and subsequently flowed through the upper surface of the upper-bridge MOS to the output-electrode copper layer with the help of the longer bonding wire on the upper surface of the upper-bridge SBD. As illustrated in FIG. 3, after the upper-bridge MOS is turned off, since the current direction of the inductive load cannot be varied suddenly, the freewheel current is flowed into the negative-electrode copper layer from the negative electrode, then flowed to the upper surface of the lower-bridge SBD with the help of the longer bonding wire on the upper surface of the lower-bridge MOS, and subsequently flowed through the output-electrode copper layer from the lower surface of the lower-bridge SBD, and finally flowed into the output electrode. As illustrated in FIG. 4, since the upper-bridge MOS and the lower-bridge SBD involved in the operation are far away and the path of the commutation loop of the upper bridge is longer, the area of the current loop of the upper bridge is also larger, which produces a larger parasitic inductance (approximately 20 nH), and the longer aluminum wire also results in the increasing of the loop resistance, and further results in the increasing of the loss. Therefore, it is necessary to develop a low-inductance power module that not only can be compatible with the existing packaging structure and but also can implement the high-frequency applications of SiC MOSFET.

SUMMARY

In order to solve the above problems, a low-inductance power module is provided in the present disclosure, which optimizes the internal structure while ensuring that the outline dimensions of the existing package are unvaried, reduces the parasitic inductance of the loop, and ensures the high-frequency application of the SiC power module.

To achieve the above objectives, the following technical solutions are provided in the present disclosure:

A low-inductance power module is provided in the present disclosure. The module comprises a housing, an upper-bridge MOS, a lower-bridge SBD, a lower-bridge MOS, an upper-bridge SBD, output electrodes, a positive electrode and a negative electrode. A bottom plate is installed inside the housing, an insulating substrate is installed on a top of the bottom plate, a positive-electrode copper layer, a negative-electrode copper layer and an output-electrode copper layer are arranged on an upper surface of the insulating substrate, the output-electrode copper layer is divided into an upper-side output-electrode copper layer and a lower-side output-electrode copper layer, the positive-electrode copper layer is divided into an upper-side positive electrode copper layer and a lower-side positive-electrode copper layer, the positive-electrode copper layer, the output-electrode copper layer and the negative-electrode copper layer are arranged staggeredly and symmetrically along an central axis of the module.

The present disclosure is further set as follows. The positive electrode and the negative electrode are both formed by an external connection component, a bent component and an internal connection component, and the bent component is located between the external connection component and the internal connection component, and the bent component and the internal connection component are provided with a part extending towards another electrode side, the positive electrode and the negative electrode are provided with a laminated structure, the positive electrode and the negative electrode each include four forms, and the four forms are respectively a first structural form, a second structural form, a third structural form and a fourth structural form.

The present disclosure is further set as follows. The first structural form is that the bent component of the positive electrode is bent downwards from a right side of the external connection component, and the bent component and the internal connection component of the positive electrode both have a part extending towards the negative electrode side, and the bent component of the negative electrode is bent downwards from the right side of the external connection component, and the bent component and the internal connection component of the negative electrode both have a part extending towards the positive electrode side.

The present disclosure is further set as follows. The second structural form is that the bent component of the positive electrode is firstly bent downwards from a front side of the external connection component, and then bent towards a rear side of the external connection component, the internal connection component has a part extending towards the negative electrode side, the bent component of the negative electrode is firstly bent downwards from the rear side of the external connection component, and then bent towards the positive electrode side, and the internal connection component has a part extending towards the positive electrode side.

The present disclosure is further set as follows. The third structural form is that the bent component of the positive electrode is bent downwards from a right side of the external connection component, and the internal connection component has a part extending towards the negative electrode side, the bent component of the negative component is bent downwards from a right side of the external connection component, and the internal connection component has a part extending towards the negative electrode side.

The present disclosure is further set as follows. The fourth structural form is that the bent component of the positive electrode is bent downwards from a right side of the external connection component, and the bent component and the internal connection component of the positive electrode both have a part extending towards the negative electrode side, and the bent component of the negative electrode is bent downwards from the right side of the external connection component, and the bent component and the internal connection component of the negative electrode both have a part extending towards the positive electrode side.

The present disclosure is further set as follows. A width of a copper sheet of is varied along a path, the width is narrowed with a current decreasing, and widened with the current increasing.

The present disclosure is further set as follows. The positive-electrode copper layer, the negative-electrode copper layer and the output-electrode copper layer are all provided with a current-sharing groove, and a length of the current-sharing groove is increased with an increasing of the width of the copper sheet.

The present disclosure is further set as follows. A laminated design is adopted by connection parts between the positive and negative electrodes and the positive and negative copper layers.

Beneficial Effects

In comparison with the known prior art, the technical solutions provided by the present disclosure have the following beneficial effects.

The layout of the chip and the copper layers are optimized in the present disclosure, which can effectively reduce the parasitic inductance and the loop resistance of the module, and further reduces the parasitic inductance by the bonding connecting wires and the laminated design adopted by the positive and negative electrodes, thereby optimizing the internal structure while ensuring that the outline dimensions of the existing package are unvaried, reducing the parasitic inductance of the loop, and ensuring the high-frequency application of the SiC power module.

DESCRIPTION OF THE EMBODIMENTS

Figure 1:
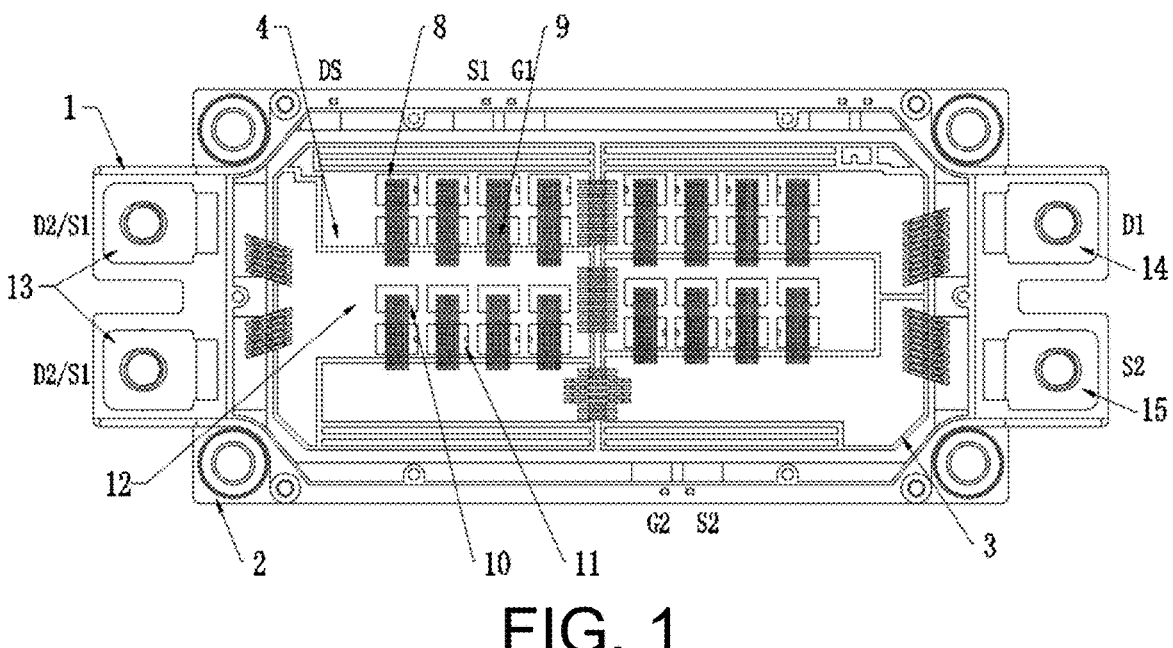
FIG. 1 illustrates a schematic diagram of a power module in the prior art.
Figure 2:
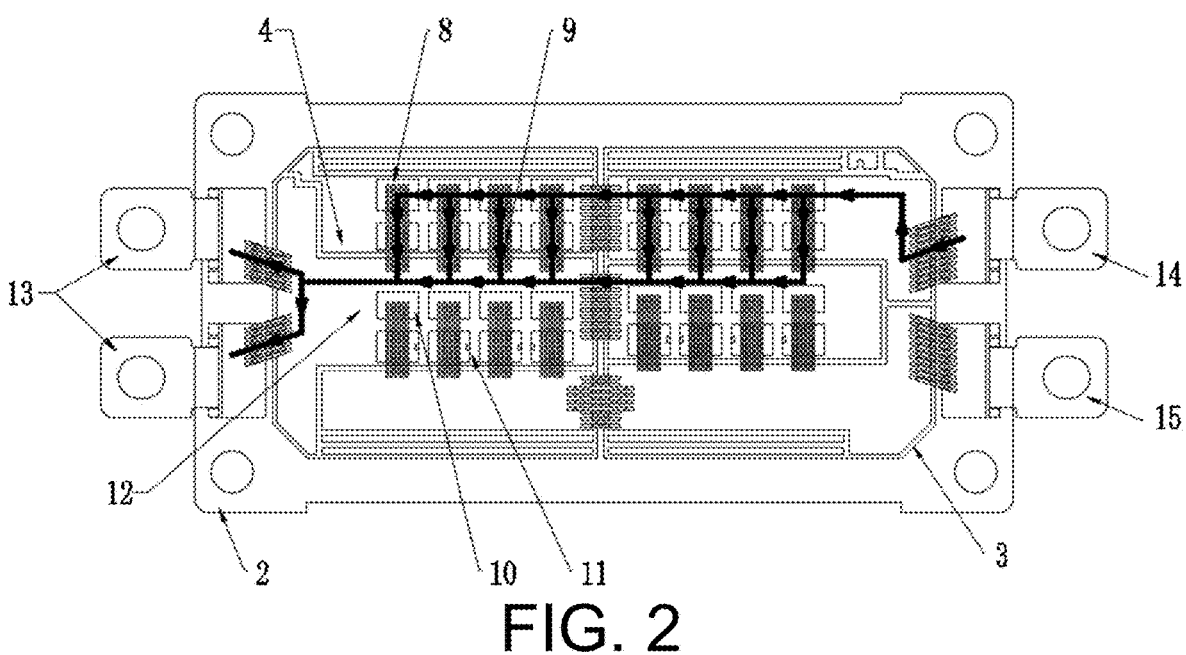
FIG. 2 illustrates a schematic diagram of an operating current loop of a SiC MOS power module in the prior art.
Figures 3, 4:
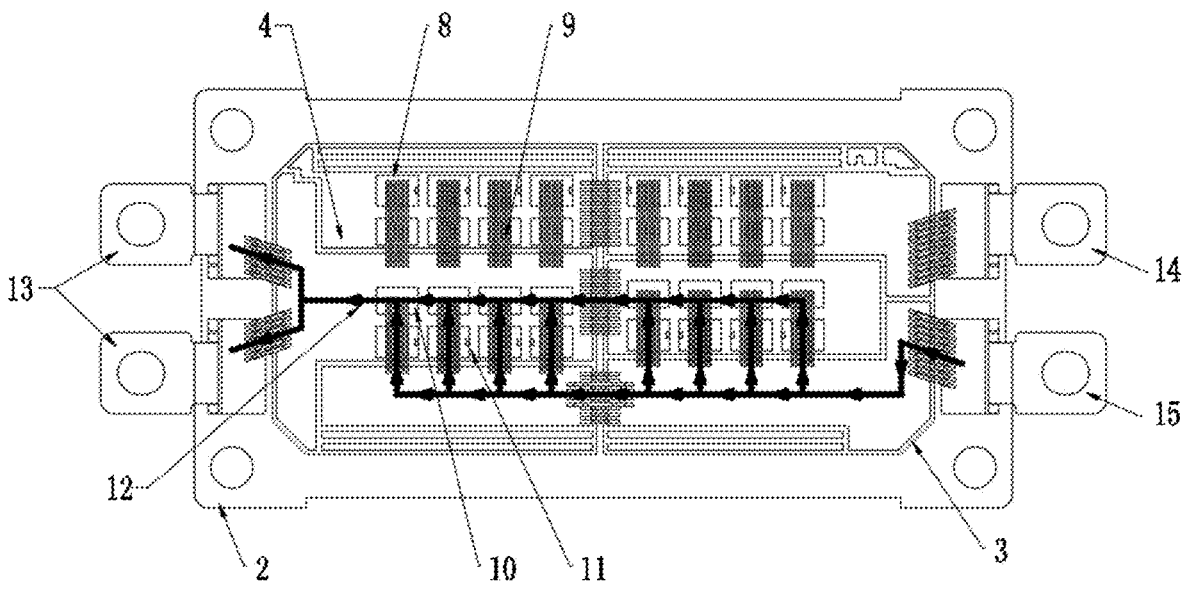
FIG. 3 illustrates a schematic diagram of an operating current loop of a SiC SBD power module in the prior art.
FIG. 4 illustrates a topological diagram of a power module in the prior art.
Figure 5:
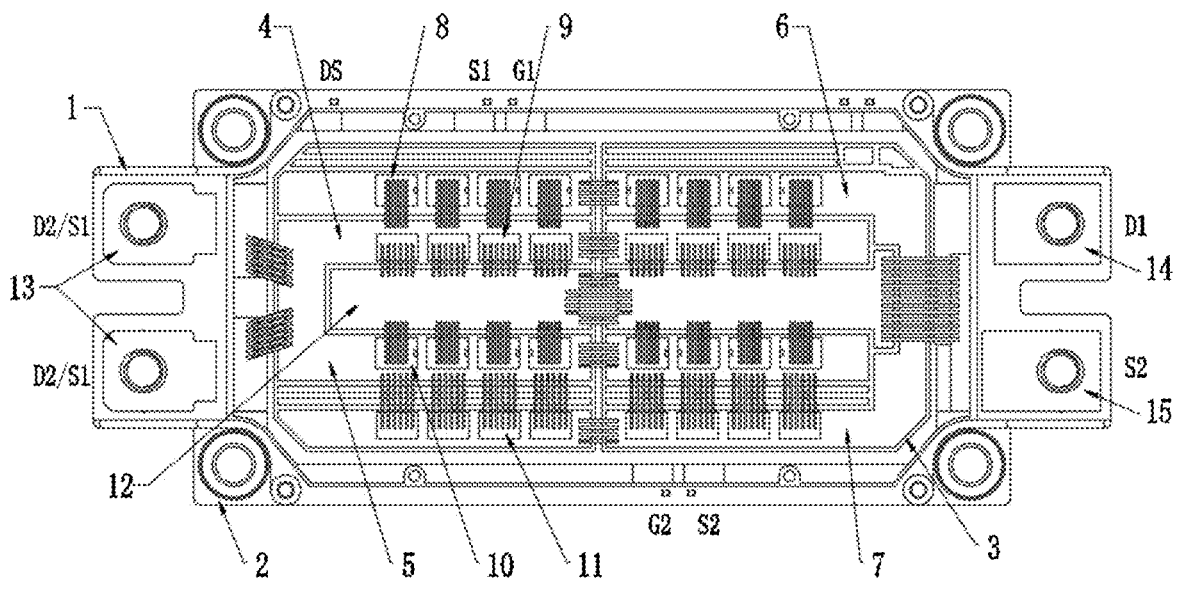
FIG. 5 illustrates a schematic diagram of a power module in Embodiment 1 of the present disclosure.
Figure 6:
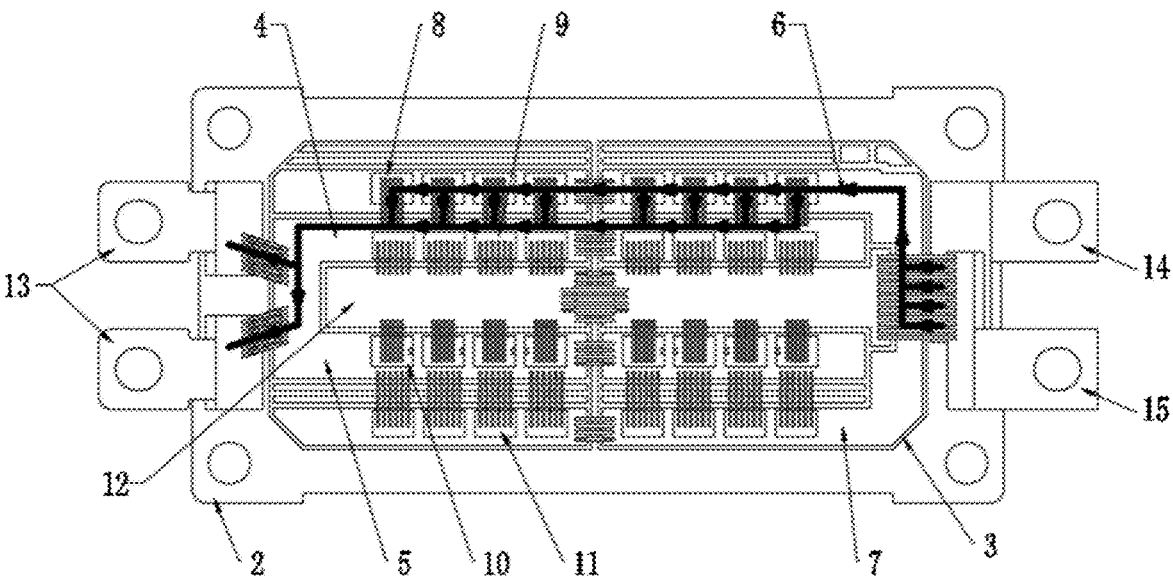
FIG. 6 illustrates a schematic diagram of an operating current loop of a SiC MOS in Embodiment 1 of the present disclosure.
Figure 7:
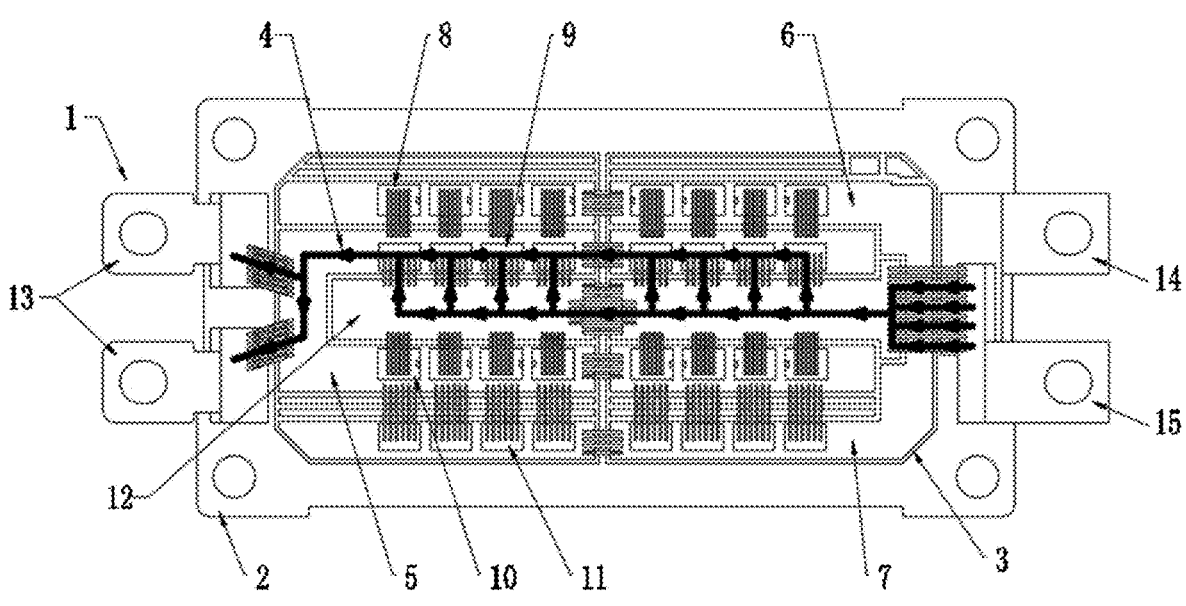
FIG. 7 illustrates a schematic diagram of an operating current loop of a SiC SBD in Embodiment 1 of the present disclosure.
Figure 8:
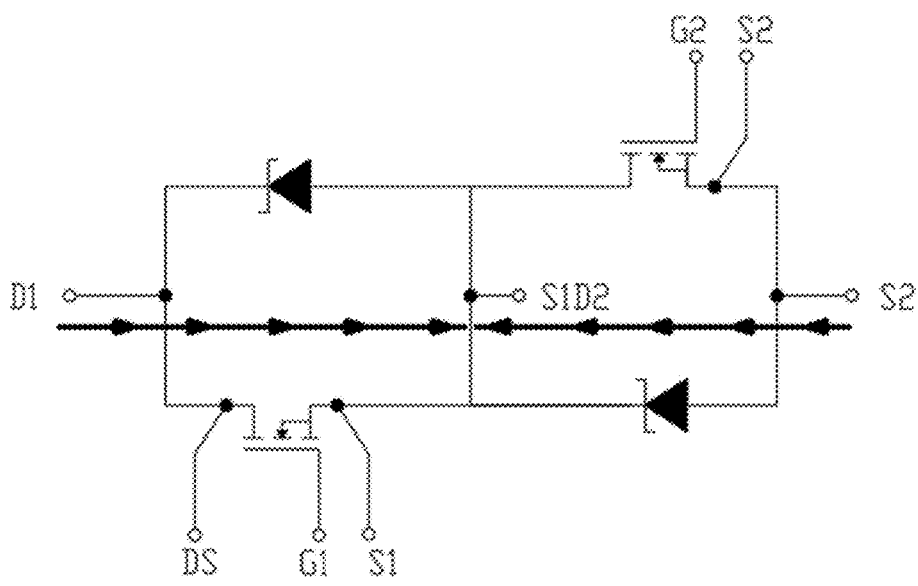
FIG. 8 illustrates a topological diagram of Embodiment 1 of the present disclosure.
Figure 9:
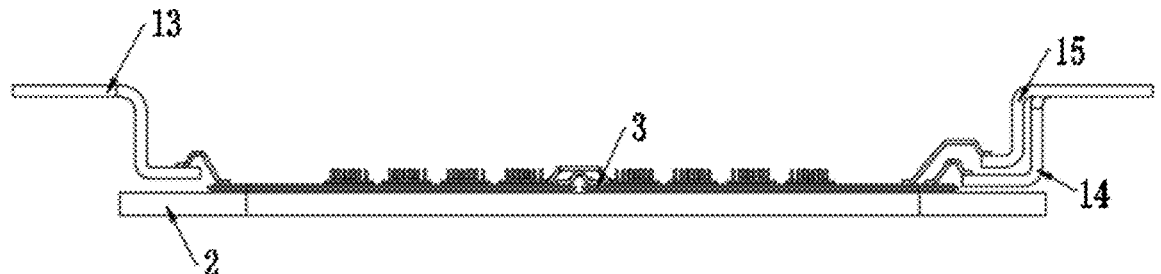
FIG. 9 illustrates a side view of a power module in Embodiment 1 of the present disclosure.
Figure 10:
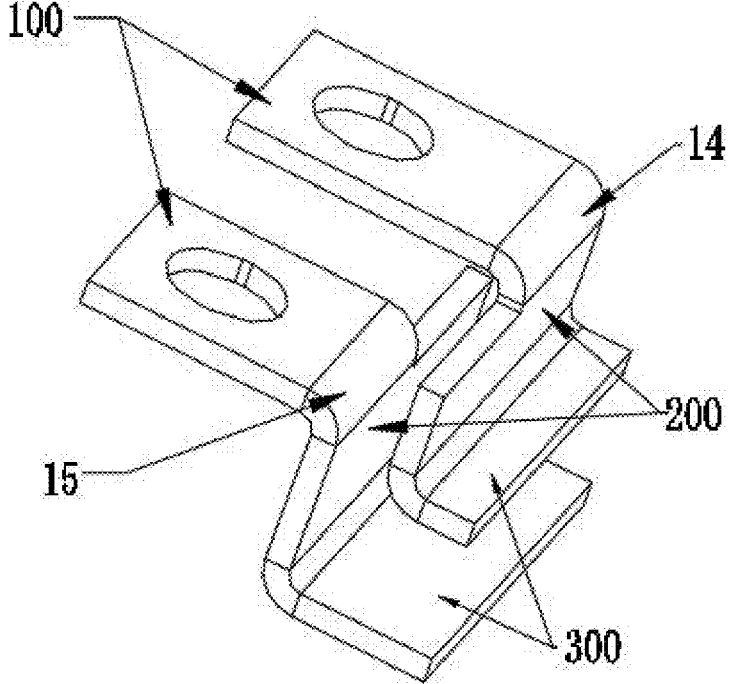
FIG. 10 illustrates a schematic diagram of a lamination of positive and negative electrodes in Embodiment 1 of the present disclosure.

The technical solutions in the embodiments of the present disclosure will be clearly and completely described with reference to the accompanying drawings in the embodiments of the present disclosure. It will be apparent that the described embodiments are merely some but not all of the embodiments of the present disclosure. All other embodiments obtained by those of ordinary skill in the art based on the embodiments of the present disclosure without creative effects shall fall within the protection scope of the present disclosure.

In the descriptions of the present disclosure, it should be noted that, the terms "upper", "lower", "inner", "outer", "top/bottom end" and the like indicate positions or positional relations based on the positions or positional relations illustrated in the drawings, and are merely for the convenience of describing the present disclosure and simplifying the descriptions, rather than indicating or implying that the device or element referred to must have a specific position, be constructed and operated in a specific position, and therefore cannot be understood as limiting the present disclosure. In addition, the terms "first" and "second" are merely used for the descriptive purposes, and cannot be understood as indicating or implying the relative importance.

In the descriptions of the present disclosure, it should be noted that, unless otherwise clearly regulated and limited, the terms "installed", "provided with", "sleeved/connected", "connected", etc. should be understood in a broad sense. For example, "connected" can be a fixed connection, a detachable connection, or an integral connection, and can be a mechanical connection or an electrical connection, and can be a direct connection or an indirect connection through an intermediate medium, and can be an internal communication of two components. For those of ordinary skilled in the art, the specific meanings of the above terms in the present disclosure can be understood according to the specific situations.

Embodiment 1

As illustrated in FIGS. 5 to 10, a low-inductance power module is provided in the present disclosure, which includes a housing 1, an upper-bridge MOS 8, a lower-bridge SBD 9, a lower-bridge MOS 10, an upper-bridge SBD 11, output electrodes 13, a positive electrode 14 and a negative electrode 15. A bottom plate 2 is installed inside the housing 1, an insulating substrate 3 is installed on the top of the bottom plate 2, a positive-electrode copper layer, a negative-electrode copper layer 12 and an output-electrode copper layer are arranged on the upper surface of the insulating substrate 3, the output-electrode copper layer is divided into an upper-side output-electrode copper layer 4 and a lower-side output-electrode copper layer 5, the positive electrode 14 is in connection with the positive-electrode copper layer through a bonding wire, the positive-electrode copper layer is divided into an upper-side positive-electrode copper layer 6 and a lower-side positive-electrode copper layer 7, and the lower surface of the upper-bridge MOS 8 is welded onto the upper-side positive-electrode copper layer 6, and the upper surface of the upper-bridge MOS8 is in connection with the upper-side output-electrode copper layer 4 through a bonding wire. The lower surface of the upper-bridge SBD11 is welded onto the lower-side positive-electrode copper layer 7, and the upper surface of the upper-bridge SBD11 is in connection with the lower-side output-electrode copper layer 5 through a bonding wire. The output electrode 13 is connection with the output-electrode copper layer through a bonding wire, the lower surface of the lower-bridge MOS10 is welded onto the lower output-electrode copper layer 5, and the upper surface of the lower-bridge MOS10 is in connection with the negative-electrode copper layer 12 through a bonding wire, the lower surface of the lower-bridge SBD9 is welded onto the upper-side output-electrode copper layer 4, and the upper surface of the lower-bridge SBD9 is in connection with the negative-electrode copper layer 12 through a bonding wire, and the negative electrode 15 is in connection with the negative-electrode copper layer 12 through a bonding wire.

Further, the positive electrode 14 and the negative electrode 15 are both formed by an external connection component 100, a bent component 200 and an internal connection component 300, and the bent component 200 is located between the external connection component 100 and the internal connection component 300. In this embodiment, a first structural form is adopted by both the positive electrode 14 and the negative electrode 15.

The bent component 200 of the positive electrode 14 is bent downward from the right side of the external connection component 100, and the bent component 200 and the internal connection component 300 of the positive electrode 14 are both have a part extending towards the negative electrode 15 side, and the bent component 200 of the negative electrode 15 is bent downwards from the right side of the external connection component 100, and the bent component 200 and the internal connection component 300 of the negative electrode 15 are both have a part extending towards the positive electrode 14 side.

In this embodiment, except the external connection component 100, a lamination design is adopted by all the rest parts of the positive electrode 14 and the negative electrode 15, which is benefit to reduce the parasitic inductance. When the upper-bridge MOS 8 is operated, the current is inputted from the positive electrode 14, then flowed through the upper-side positive-electrode copper layer 6 to the lower surface of upper-bridge MOS 8, and subsequently flowed from the upper surface of the upper-bridge MOS 8 through the shorter bonding wire to the upper-side output-electrode copper layer 4.

Since the upper-bridge MOS8 and the lower-bridge SBD9 involved in the operation are close to each other, the path of the commutation loop of the upper bridge is shorter, the area of the current loop of the upper bridge is also smaller, and the parasitic inductance is reduced correspondingly. Since the aluminum wire is shorter, the loop resistance is further reduced, thereby reducing the loss. In addition, in combination with FIG. 9, it can be seen that the bonding wires of the positive electrode 14 and the negative electrode 15 are in the laminated design, and the positive electrode 14 and the negative electrode 15 are in the laminated design partially, which are benefit to reduce the inductance of the loop. After the low-inductance module of the present disclosure is simulated and analyzed, the loop inductance is reduced to approximately 13.5 nH, and is decreased by approximately 32% year-on-year.

Embodiment 2

Figure 11:
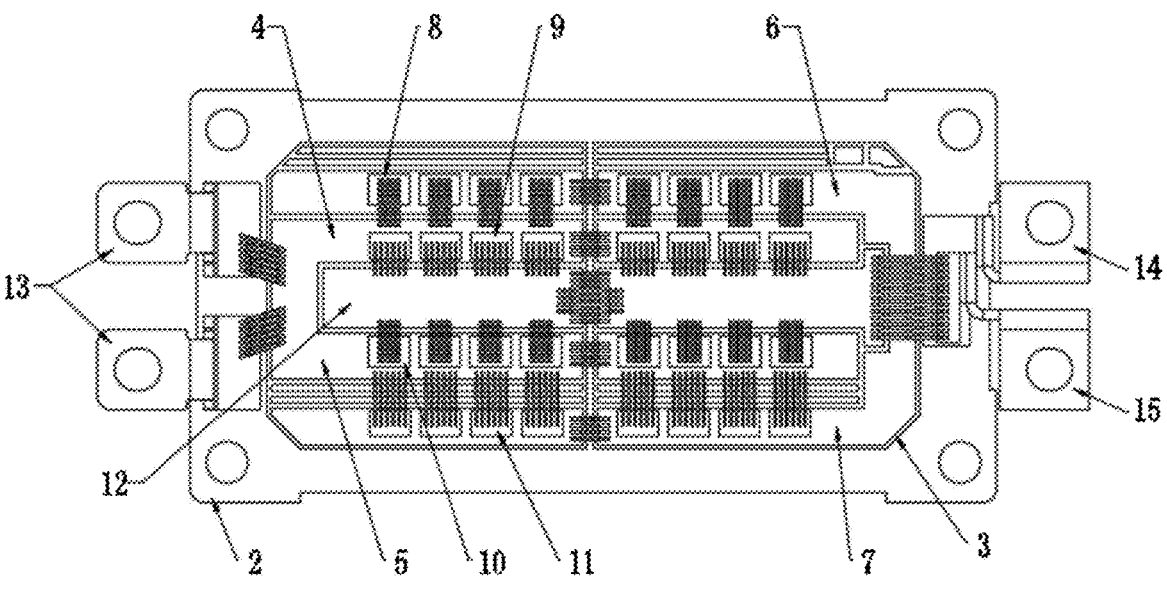
FIG. 11 illustrates a schematic diagram of a power module in Embodiment 2 of the present disclosure.
Figure 12:
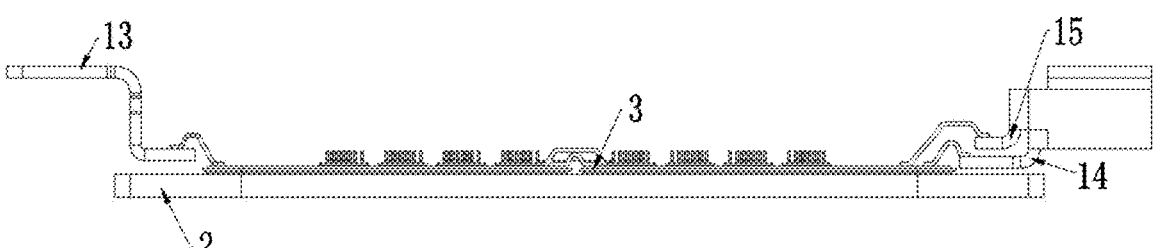
FIG. 12 illustrates a side view of a power module in Embodiment 2 of the present disclosure.
Figure 13:
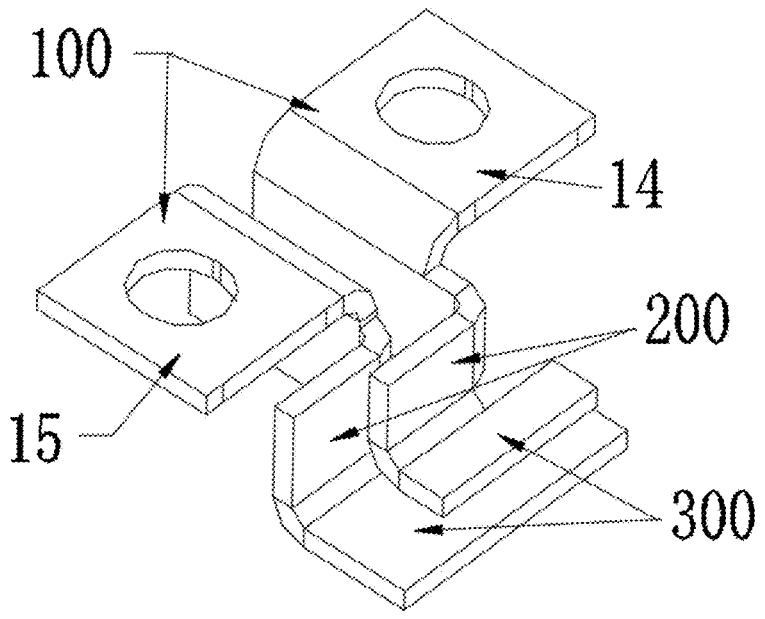
FIG. 13 illustrates a schematic diagram of a lamination of positive and negative electrodes in Embodiment 2 of the present disclosure.

As illustrated in FIGS. 11 to 13, a low-inductance power module provided in this embodiment is substantially the same as that in Embodiment 1, and the main difference lies in that the second structural form is adopted by both the positive electrode 14 and the negative electrode 15, which is as follows. The bent component 200 of the positive electrode 14 is firstly bent downwards from the front side of the external connection component 100, and then bent towards the rear side of the external connection component 100, and the internal connection component 300 has a part extending towards the negative electrode 15 side, and the bent component 200 of the negative electrode 15 is firstly bent downwards from the rear side of the external connection component 100, and then bent towards the positive electrode 14 side, and the internal connection component 300 has a part extending towards the positive electrode 14 side. In this embodiment, except the external connection component 100, a laminated design is adopted by all the rest parts of the positive electrode 14 and the negative electrode 15, which is benefit to reduce the parasitic inductance.

Embodiment 3

Figure 14:
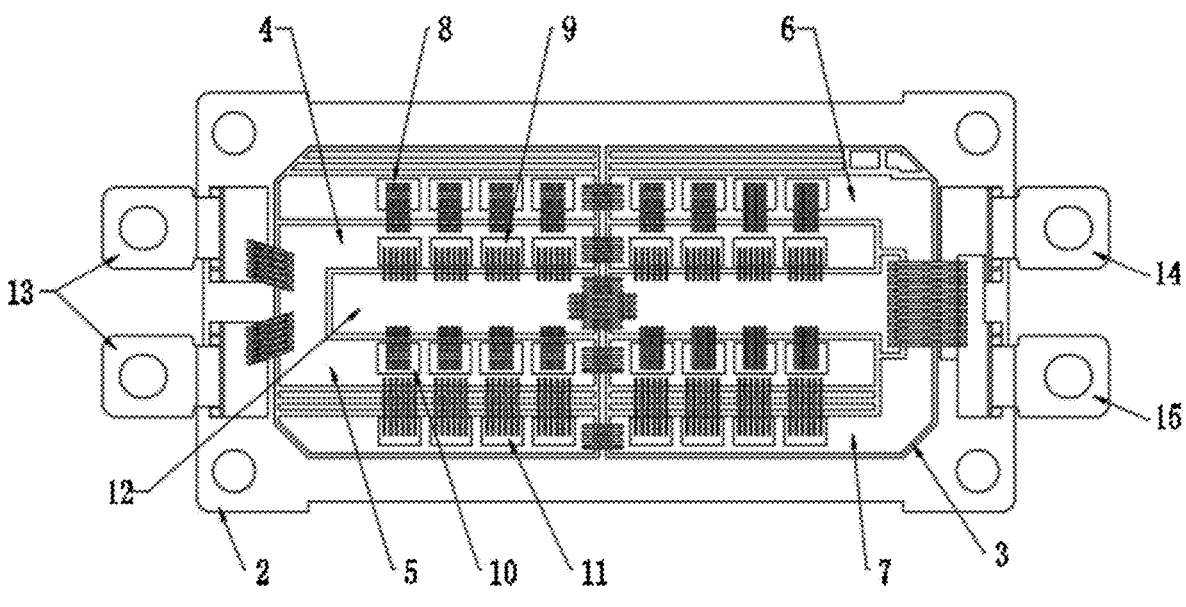
FIG. 14 illustrates a schematic diagram of a power module in Embodiment 3 of the present disclosure.
Figure 15:
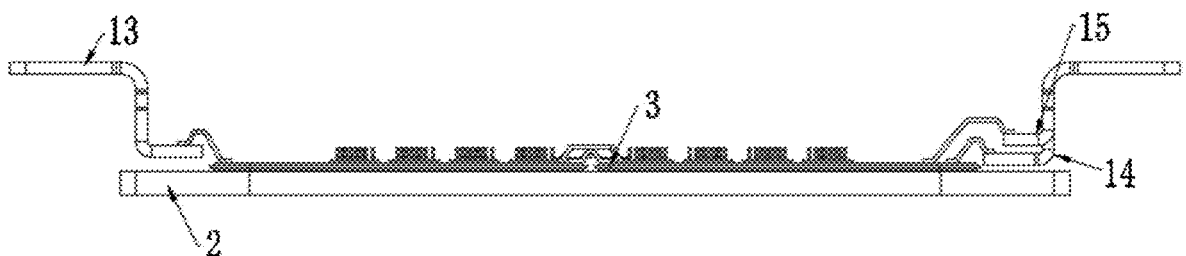
FIG. 15 illustrates a side view of a power module in Embodiment 3 of the present disclosure.
Figure 16:
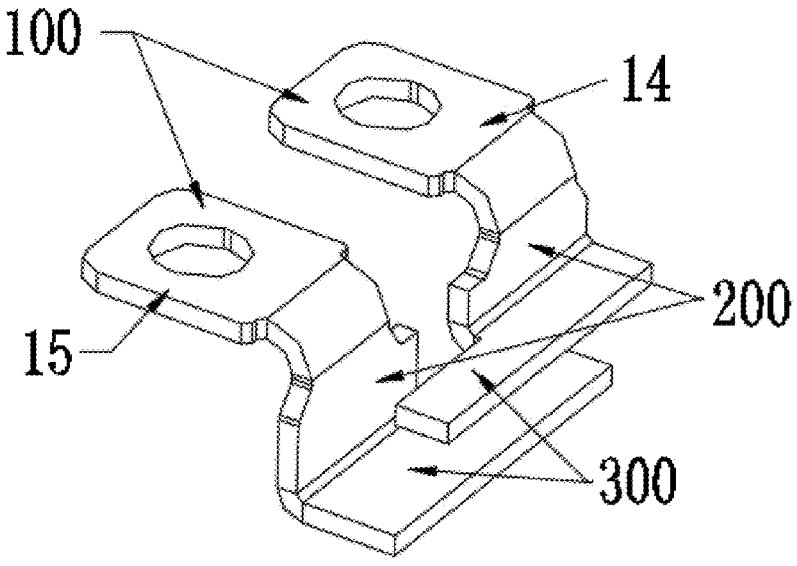
FIG. 16 illustrates a schematic diagram of a lamination of positive and negative electrodes in Embodiment 3 of the present disclosure.

As illustrated in FIGS. 14 to 16, a low-inductance power module provided in this embodiment is substantially the same as that in Embodiment 1, and the main difference lies in that a third structural form is adopted by both the positive electrode 14 and the negative electrode 15, which is as follows. The bent component 200 of the positive electrode 14 is bent downwards from the right side of the external connection component 100, and the internal connection component 300 has a part extending towards the negative electrode 15 side, and the bent component 200 of the negative electrode 15 is bent downwards from the right side of the external connection component 100, and the internal connection component 300 has a part extending towards the negative electrode 15 side. In this embodiment, except for the external connection component 100, a laminated design is adopted by all the rest parts of the positive electrode 14 and the negative electrode 15, which is benefit to reduce the parasitic inductance.

Embodiment 4

Figures 17, 18:
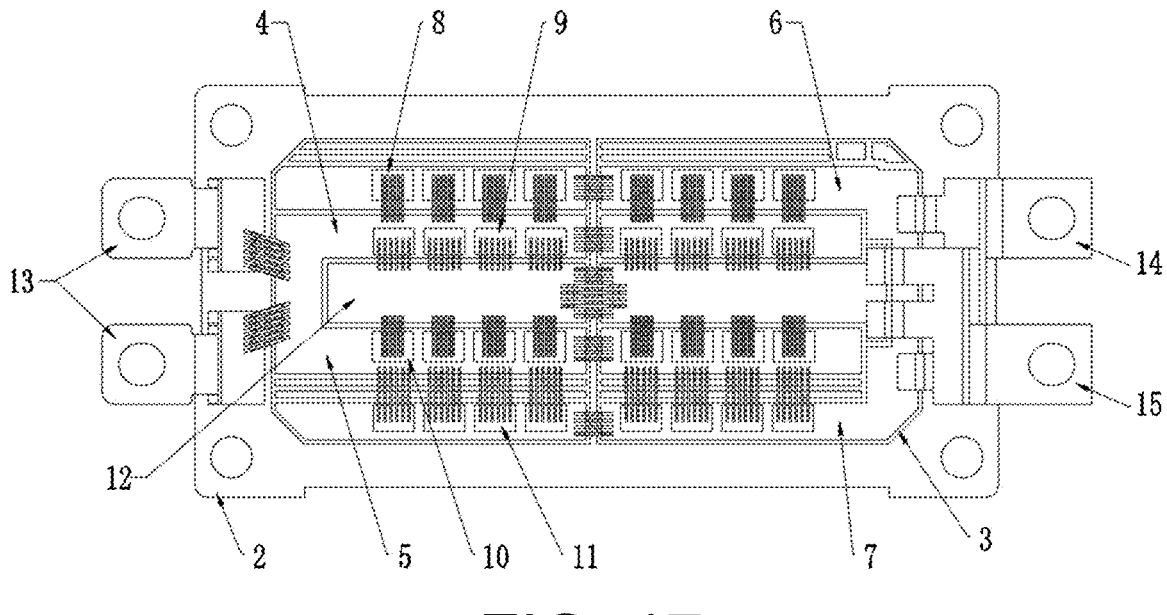
FIG. 17 illustrates a schematic diagram of a power module in Embodiment 4 of the present disclosure.
FIG. 18 illustrates a side view of a power module in Embodiment 4 of the present disclosure.
Figure 19:
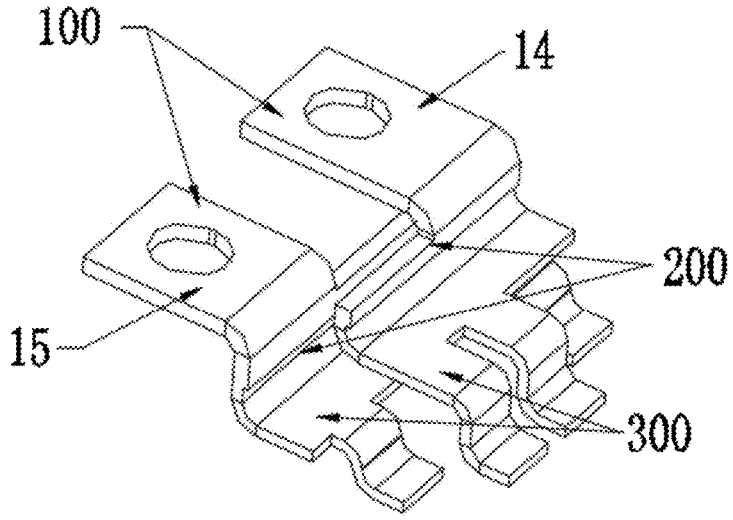
FIG. 19 illustrates a schematic diagram of a lamination of positive and negative electrodes in Embodiment 4 of the present disclosure.

As illustrated in FIGS. 17 to 19, a low-inductance power module provided in this embodiment is substantially the same as that in Embodiment 1, and the main difference lies in that the fourth structural form is adopted by both the positive electrode 14 and the negative electrode 15, which is as follows. The bent component 200 of the positive electrode 14 is bent downwards from the right side of the external connection component 100, the bent component of the positive electrode 14 and the internal connection component 300 both have a part extending towards the negative electrode 15, the bent component of the negative electrode 15 is bent downward from the right side of the external connection component 100, and the bent component 200 of the negative electrode 15 and the internal connection component 300 both have a part extending towards the positive electrode 14 side. It should be described that, the internal connection components 300 of the positive electrode 14 and the negative electrode 15 are in connection with the corresponding copper layers through the ultrasonic welding. Except the external connection component 100, the laminated design is adopted by all the rest parts of the positive electrode 14 and the negative electrode 15, which is benefit to reduce the parasitic inductance.

Embodiment 5

Figure 20:
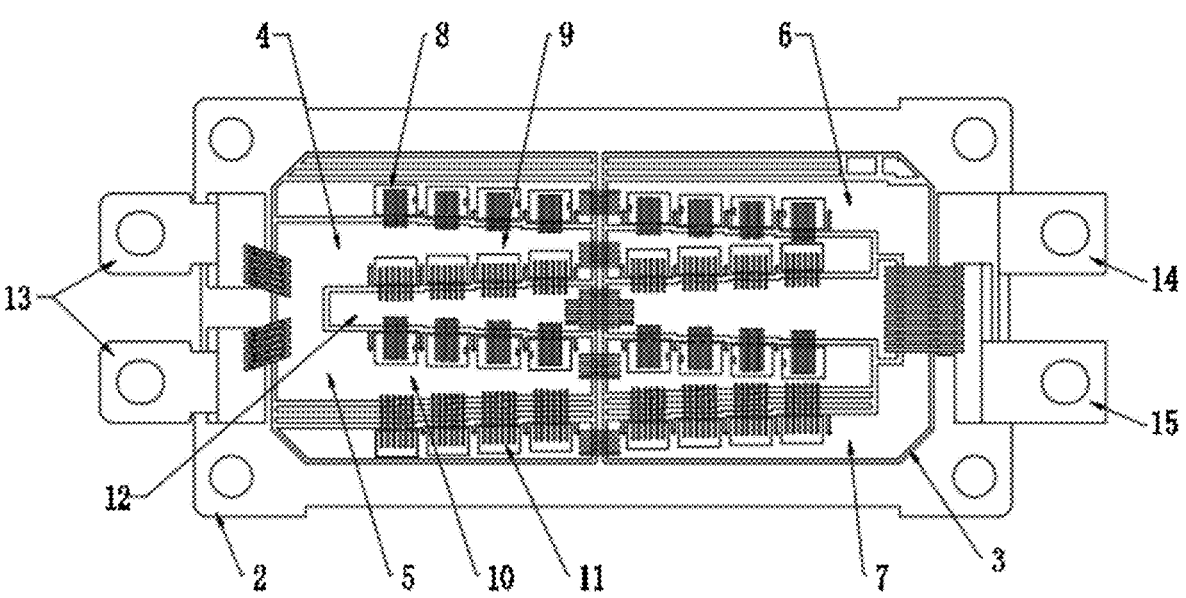
FIG. 20 illustrates a schematic diagram of a power module in Embodiment 5 of the present disclosure.
Figure 21:
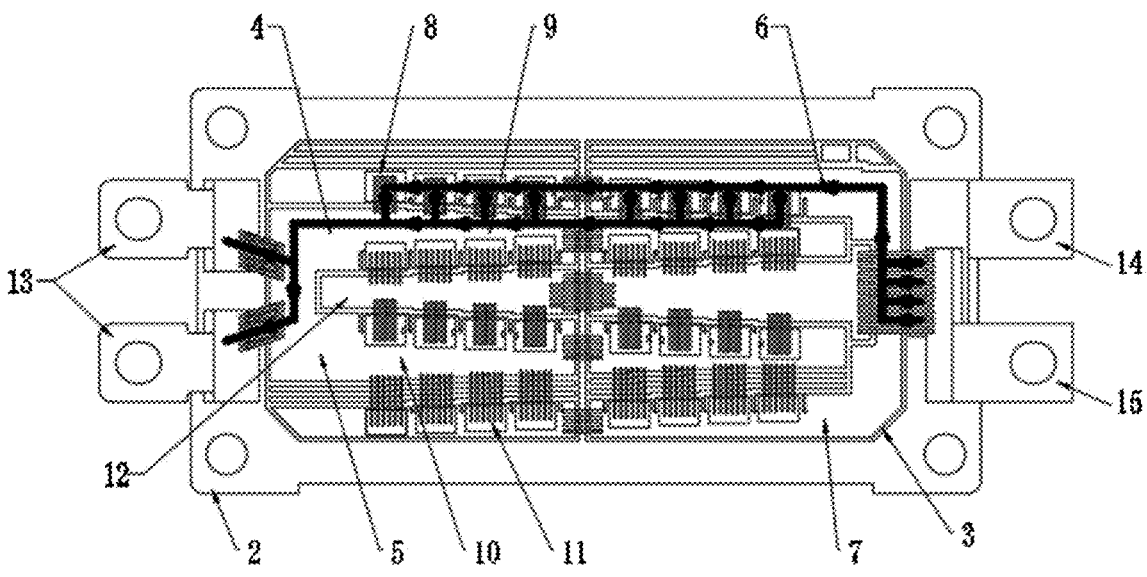
FIG. 21 illustrates a schematic diagram of an operating current loop of a SiC MOS in Embodiment 5 of the disclosure.
Figure 22:
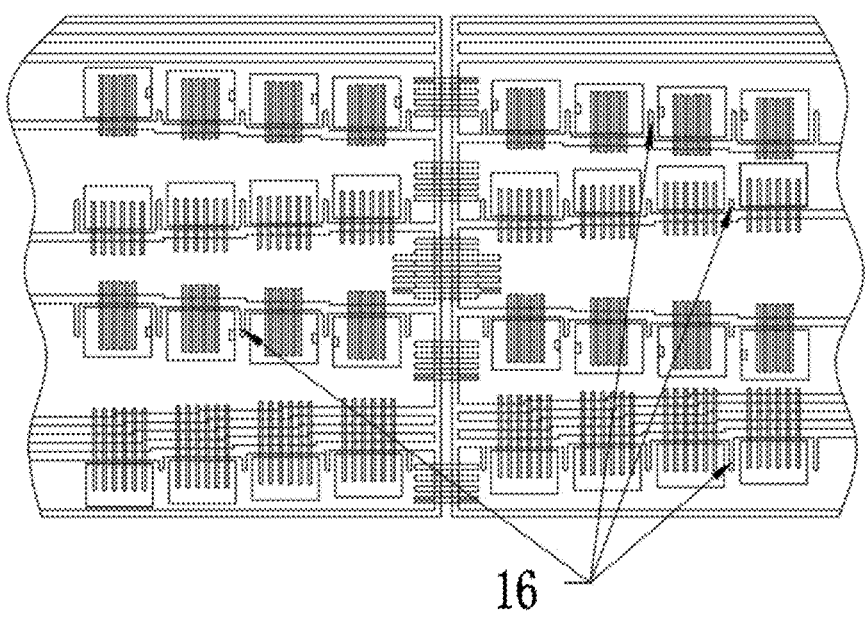
FIG. 22 illustrates a schematic diagram of a current-sharing groove in Embodiment 5 of the present disclosure.

As illustrated in FIGS. 20 to 22, a low-inductance power module provided in this embodiment is substantially the same as that in Embodiment 1, and the main difference lies in that the layouts of the positive-electrode copper layer, the negative-electrode copper layer 12 and the output-electrode copper layer are all optimized, that is, the positive-electrode copper layer, the negative-electrode copper layer 12 and the output-electrode copper layer are all provided with a current-sharing groove 16. As illustrated in FIG. 21, the width of the copper layer is narrowed with the current decreasing, and widened with the current increasing, and as illustrated in FIG. 22, the current-sharing groove 16 is arranged around the chip, and the length of the current-sharing groove becomes longer as the width of the copper sheet increases. For the multi-chip parallel module of the present disclosure, the current and inductance among the chips can be effectively balanced to implement the current-sharing effect with the help of the variation of the width of the copper layer and the adding of the current-sharing groove.

The above embodiments are merely used to illustrate the technical solutions of the present disclosure, rather than to limit the same. Although the present disclosure has been described in detail with reference to the aforementioned embodiments, those skilled in the art should understand that the technical solutions described in the aforementioned embodiments may still be modified, or some of the technical features may be replaced by equivalents, however, such the modifications or replacements cannot make the essence of the corresponding technical solutions to deviate from the spirit and scope of the technical solutions of the embodiments of the present disclosure.

What is claimed is:

1. A low-inductance power module, comprising a housing (1), an upper-bridge MOS (8), a lower-bridge SBD (9), a lower-bridge MOS (10), an upper-bridge SBD (11), output electrodes (13), a positive electrode (14) and a negative electrode (15), wherein a bottom plate (2) is installed inside the housing (1), an insulating substrate (3) is installed on a top of the bottom plate (2), a positive-electrode copper layer, a negative-electrode copper layer (12) and an output-electrode copper layer are arranged on an upper surface of the insulating substrate (3), wherein the output-electrode copper layer is divided into an upper-side output-electrode copper layer (4) and a lower-side output-electrode copper layer (5), the positive-electrode copper layer is divided into an upper-side positive electrode copper layer (6) and a lower-side positive-electrode copper layer (7), the positive-electrode copper layer, the output-electrode copper layer and the negative-electrode copper layer (12) are arranged staggeredly and symmetrically along a central axis of the module.

2. The low-inductance power module according to claim 1, wherein the positive electrode (14) and the negative electrode (15) are both formed by an external connection component (100), a bent component (200) and an internal connection component (300), and the bent component (200) is located between the external connection component (100) and the internal connection component (300), and the bent component (200) and the internal connection component (300) are provided with a part extending towards another electrode side, the positive electrode (14) and the negative electrode (15) are provided with a laminated structure, the positive electrode (14) and the negative electrode (15) each include four forms, and the four forms are respectively a first structural form, a second structural form, a third structural form and a fourth structural form.

3. The low-inductance power module according to claim 2, wherein the first structural form is that the bent component (200) of the positive electrode (14) is bent downwards from a right side of the external connection component (100), and the bent component (200) and the internal connection component (300) of the positive electrode (14) both have a part extending towards the negative electrode (15) side, and the bent component (200) of the negative electrode (15) is bent downwards from the right side of the external connection component (100), and the bent component (200) and the internal connection component (300) of the negative electrode (15) both have a part extending towards the positive electrode (14) side.

4. The low-inductance power module according to claim 2, wherein the second structural form is that the bent component (200) of the positive electrode (14) is firstly bent downwards from a front side of the external connection component (100), and then bent towards a rear side of the external connection component (100), the internal connection component (300) has a part extending towards the negative electrode (15) side, the bent component (200) of the negative electrode (15) is firstly bent downwards from the rear side of the external connection component (100), and then bent towards the positive electrode (14) side, and the internal connection component (300) has a part extending towards the positive electrode (14) side.

5. The low-inductance power module according to claim 2, wherein the third structural form is that the bent component (200) of the positive electrode (14) is bent downwards from a right side of the external connection component (100), and the internal connection component (300) has a part extending towards the negative electrode (15) side, the bent component (200) of the negative component (15) is bent downwards from a right side of the external connection component (100), and the internal connection component (300) has a part extending towards the negative electrode (15) side.

6. The low-inductance power module according to claim 2, wherein the fourth structural form is that the bent component (200) of the positive electrode (14) is bent downwards from a right side of the external connection component (100), and the bent component (200) and the internal connection component (300) of the positive electrode (14)

both have a part extending towards the negative electrode (15) side, and the bent component (200) of the negative electrode (15) is bent downwards from the right side of the external connection component (100), and the bent component (200) and the internal connection component (300) of the negative electrode (15) both have a part extending towards the positive electrode (14) side.

7. The low-inductance power module according to claim 1, wherein a width of a copper sheet is varied along a path, the width is narrowed with a current decreasing, and widened with the current increasing.

8. The low-inductance power module according to claim 7, wherein the positive-electrode copper layer, the negative-electrode copper layer (12) and the output-electrode copper layer are all provided with a current-sharing groove (16), and a length of the current-sharing groove (16) is increased with an increasing of the width of the copper sheet.

9. The low-inductance power module according to claim 1, wherein a laminated design is adopted by connection parts between the positive and negative electrodes and the positive and negative copper layers.

\* \* \* \* \*